US008358153B2

(12) United States Patent
Worledge et al.

(10) Patent No.: US 8,358,153 B2
(45) Date of Patent: Jan. 22, 2013

(54) MAGNETIC LOGIC CIRCUITS FORMED WITH TAPERED MAGNETIC WIRES

(75) Inventors: Daniel Christopher Worledge, Cortlandt Manor, NY (US); David William Abraham, Croton, NY (US)

(73) Assignee: International Business Machines Corporation, Armonk, NY (US)

( * ) Notice: Subject to any disclaimer, the term of this patent is extended or adjusted under 35 U.S.C. 154(b) by 423 days.

(21) Appl. No.: 12/783,208

(22) Filed: May 19, 2010

(65) Prior Publication Data

US 2011/0286255 A1 Nov. 24, 2011

(51) Int. Cl.
*H03K 19/20* (2006.01)
*G11C 19/08* (2006.01)
*G06F 7/50* (2006.01)

(52) U.S. Cl. .......... 326/104; 365/158; 365/41; 977/940; 977/859

(58) Field of Classification Search .......... 326/104, 326/37–41; 365/41, 55, 158, 222; 977/762, 977/838, 859, 940
See application file for complete search history.

(56) References Cited

U.S. PATENT DOCUMENTS

| 6,867,988 B2 * | 3/2005 | Cowburn ............... 365/41 |
| 6,980,468 B1 | 12/2005 | Ounadjela |
| 7,098,494 B2 | 8/2006 | Pakala et al. |
| 7,180,770 B2 | 2/2007 | Perner et al. |
| 7,242,604 B2 | 7/2007 | Klaeui et al. |
| 7,372,116 B2 | 5/2008 | Fullerton et al. |
| 7,397,077 B2 | 7/2008 | Nickel |
| 7,522,446 B2 | 4/2009 | Lee et al. |
| 7,554,835 B2 * | 6/2009 | Cowburn et al. ............... 365/158 |
| 7,588,945 B2 | 9/2009 | Min et al. |
| 7,613,040 B1 | 11/2009 | Nickel et al. |
| 7,825,686 B2 * | 11/2010 | Hoeink et al. ............... 326/38 |
| 8,058,906 B2 * | 11/2011 | Niemier et al. ............... 326/104 |
| 2007/0030718 A1 | 2/2007 | Cowburn |
| 2010/0103721 A1 | 4/2010 | Guha et al. |

FOREIGN PATENT DOCUMENTS

| JP | 2005150739 A | 6/2005 |
| WO | WO02/41492 A1 | 5/2002 |

OTHER PUBLICATIONS

D.A. Allwood et al., "Magnetic Domain-Wall Logic," Science, Sep. 9, 2005, pp. 1688-1692, vol. 309, No. 5741.
X. Zhu et al., "Spatially Resolved Observation of Domain-Wall Propagation in a Submicron Ferromagnetic NOT-Gate," Journal of Applied Physics Letter, Aug. 2005, pp. 062503-1-062503-3, vol. 87, No. 6.

(Continued)

*Primary Examiner* — Vibol Tan
(74) *Attorney, Agent, or Firm* — Vazken Alexanian; Ryan, Mason & Lewis, LLP

(57) ABSTRACT

A magnetic circuit in one aspect comprises a plurality of tapered magnetic wires each having a relatively wide input end and a relatively narrow output end, with the output end of a first one of the tapered magnetic wires being coupled to the input end of a second one of the tapered magnetic wires. Each of the tapered magnetic wires is configured to propagate a magnetic domain wall along a length of the wire in a direction of decreasing width from its input end to its output end. In an illustrative embodiment, the magnetic circuit comprises a logic buffer that includes at least one heating element. The heating element may be controlled to facilitate transfer of a magnetic moment from the output end of the first tapered magnetic wire to the input end of the second tapered magnetic wire.

20 Claims, 12 Drawing Sheets

OTHER PUBLICATIONS

A. Himeno et al., "Propagation of a Magnetic Domain Wall in Magnetic Wires with Asymmetric Notches," Journal of Applied Physics Letter, Mar. 15, 2005, pp. 066101-1-066101-3, vol. 97, No. 6.

T. Ono et al., "Propagation of the Magnetic Domain Wall in Submicron Magnetic Wire Investigated by Using Giant Magnetoresistance Effect," Journal of Applied Physics, Apr. 1999, pp. 6181-6183, vol. 85, No. 8.

* cited by examiner

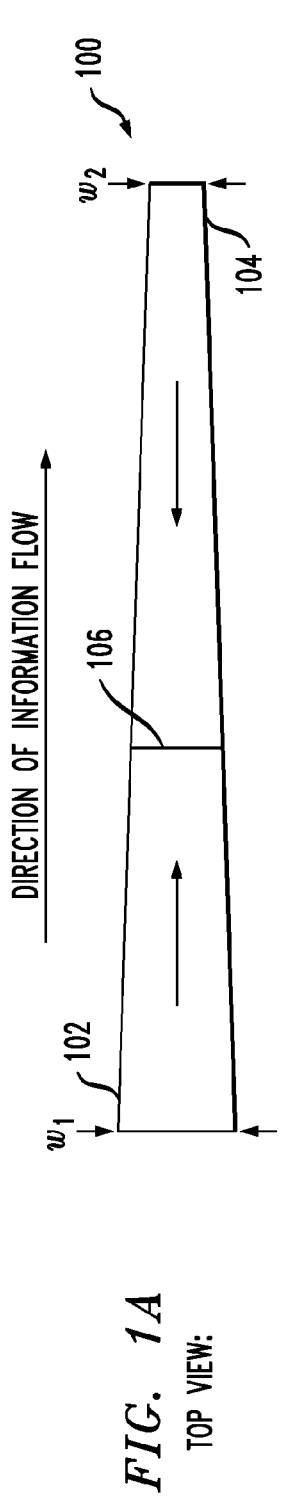
FIG. 1A
TOP VIEW:
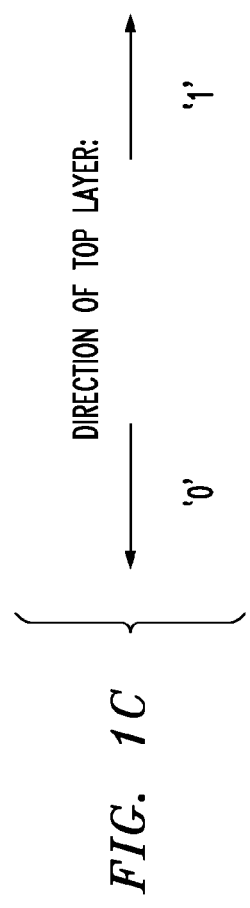
FIG. 1B
SIDE VIEW:
FIG. 1C

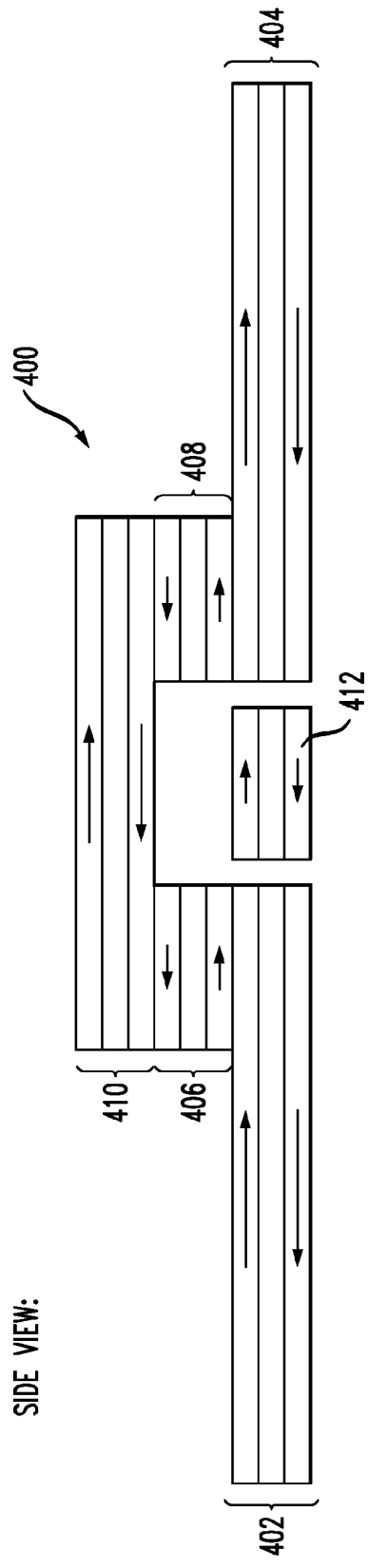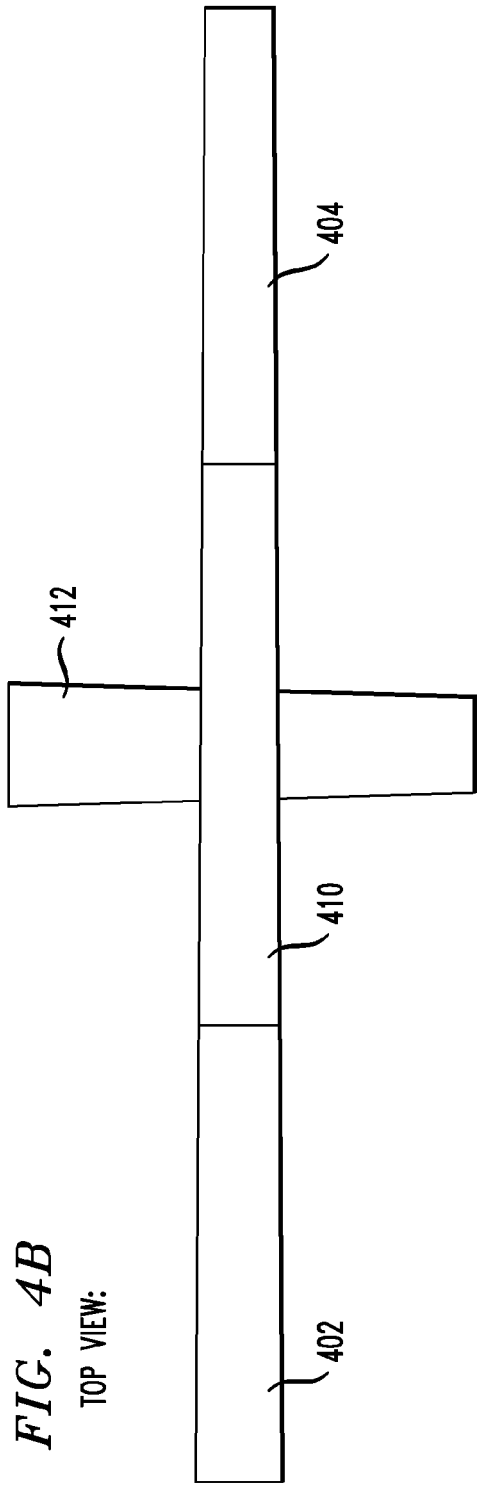
FIG. 4A SIDE VIEW:
FIG. 4B TOP VIEW:

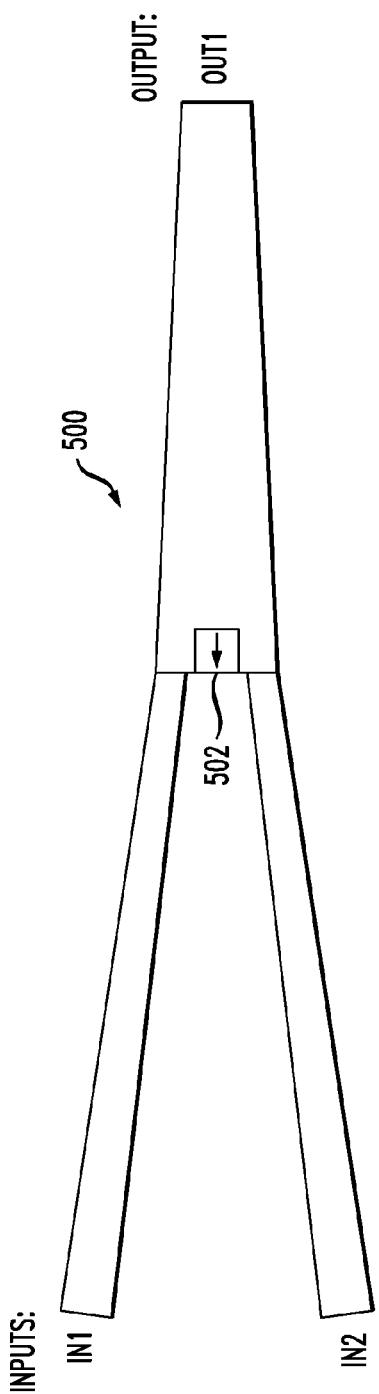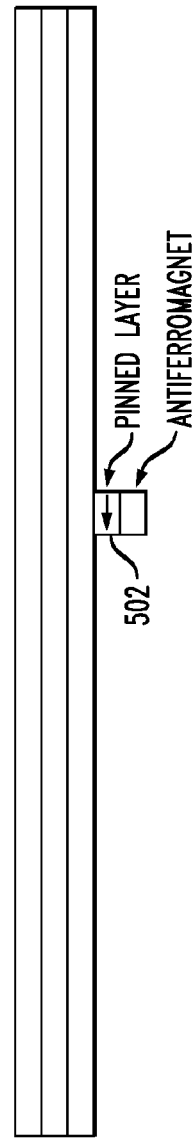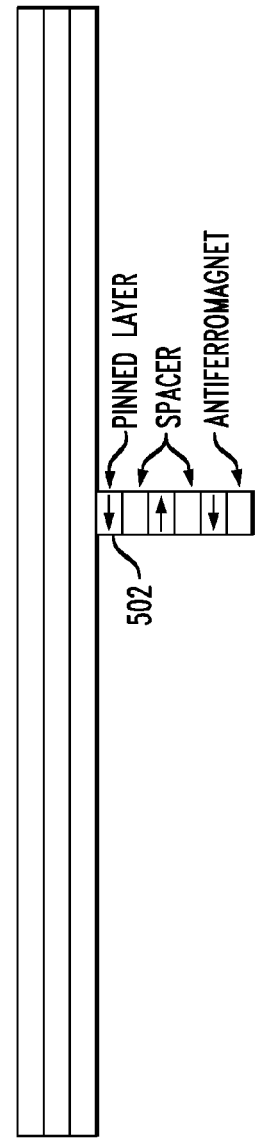
FIG. 5A
FIG. 5B
FIG. 5C

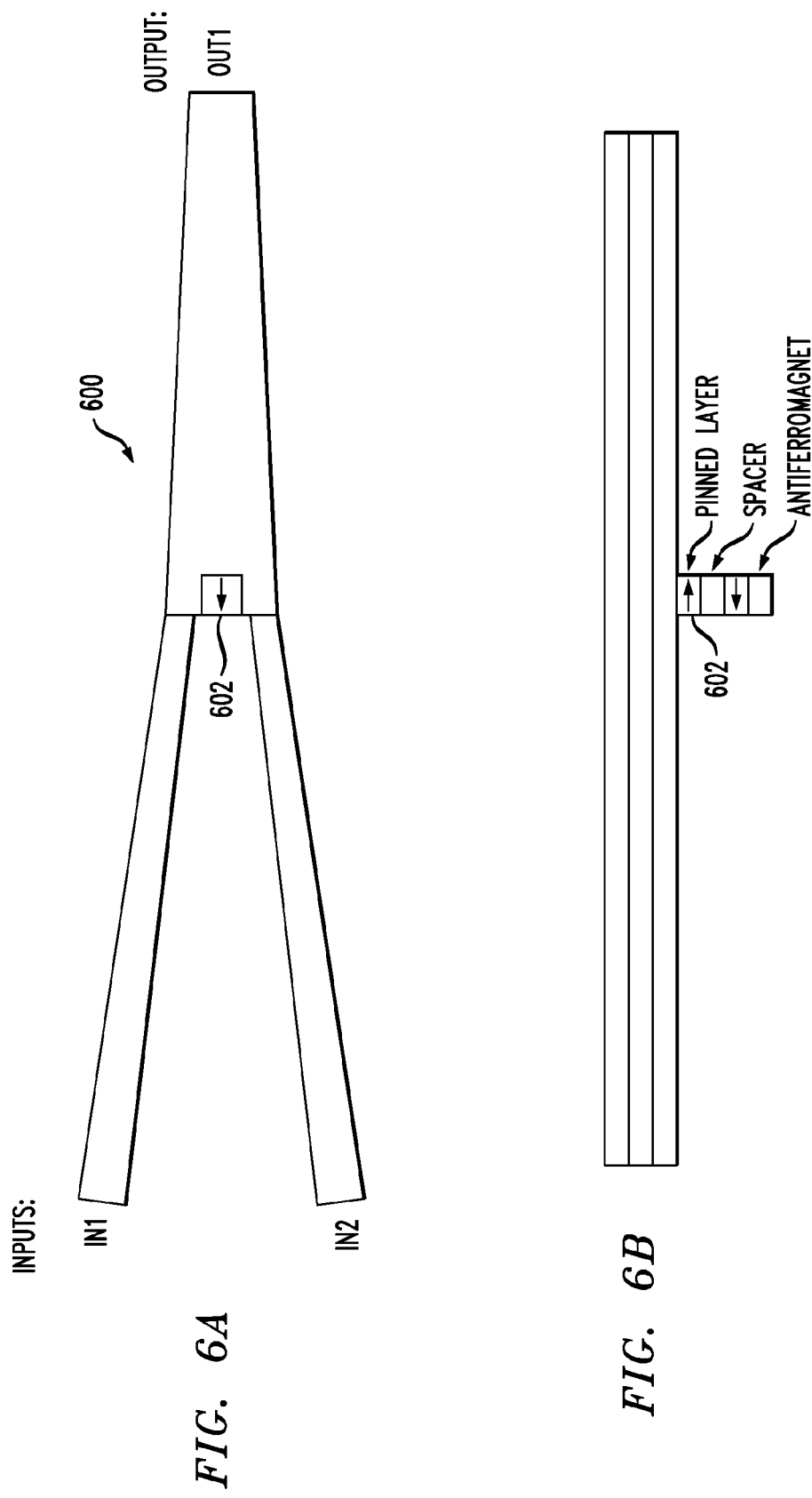

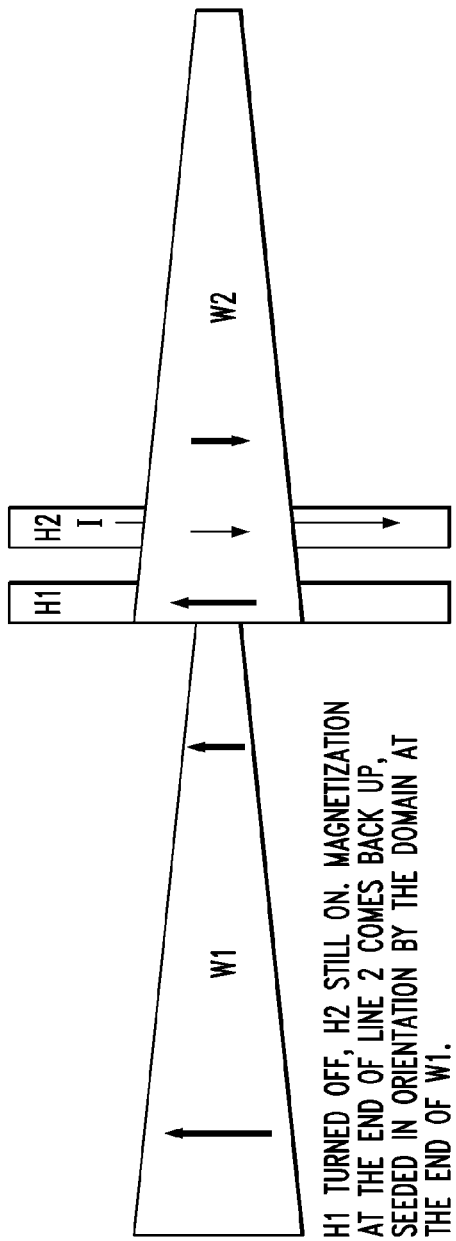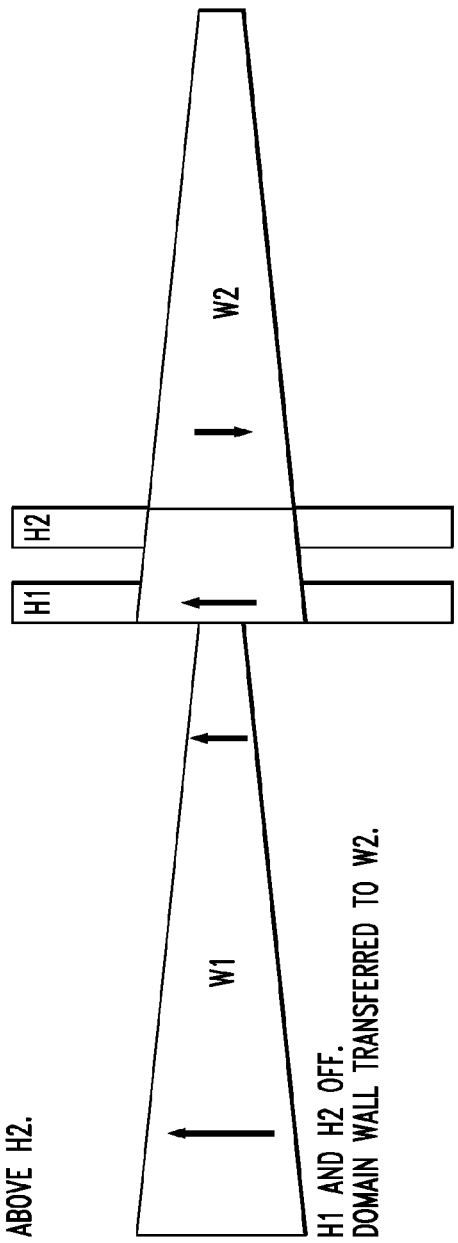
FIG. 11C  H1 TURNED OFF, H2 STILL ON. MAGNETIZATION AT THE END OF LINE 2 COMES BACK UP, SEEDED IN ORIENTATION BY THE DOMAIN AT THE END OF W1. NOTE THAT THE MOMENT IN W2 TO THE RIGHT OF H2 DOES NOT INFLUENCE THE DOMAIN IN W2 ABOVE H1 SINCE MAGNETIZATION PATH IS 'BROKEN' BY THE ELEVATED TEMPERATURE ABOVE H2.
FIG. 11D  H1 AND H2 OFF. DOMAIN WALL TRANSFERRED TO W2.

AFTER HEAT IS REMOVED FROM HEATER THE MAGNETIZATION RECOVERS, STARTING FROM THE EDGES. THIS RESULTS IN FORMATION OF DOMAIN DUE TO PROPAGATION OF MAGNETIZATION FROM THE DOMAINS IN W1 AND W2.

US 8,358,153 B2

MAGNETIC LOGIC CIRCUITS FORMED WITH TAPERED MAGNETIC WIRES

FIELD OF THE INVENTION

The present invention relates generally to logic gates, logic buffers and other types of logic circuits and circuit elements, and more particularly to magnetic logic circuitry.

BACKGROUND OF THE INVENTION

A significant problem associated with conventional electronic circuitry such as complementary metal-oxide-semiconductor (CMOS) circuits is that these circuits dissipate considerable amounts of power. The problem is getting worse as transistor size continues to be scaled down.

Various attempts have been made to address this problem by developing alternative circuit structures that do use as much energy as CMOS circuits. One such approach involves the construction of magnetic logic elements based on the propagation of magnetic domain walls in submicrometer planar nanowires. See D. A. Allwood et al., "Magnetic Domain-Wall Logic," Science, Vol. 309, No. 5741, pp. 1688-1692, 9 Sep. 2005. In this approach, a magnetic domain wall, which is a transition between two different directions of magnetization representing respective first and second binary logic states, is propagated through a complex network of nanowires under the action of an externally applied magnetic field. This field rotates in the plane of the magnetic logic circuitry and acts as both the clock and the power supply. However, the requirement of an externally applied magnetic field is a significant drawback, as it unduly increases the cost and complexity of the circuitry.

An alternative implementation avoids the need for the externally applied magnetic field by using an array of electrical contacts adapted to make electrical connection with respective spaced points on a nanowire. The electrical contacts are coupled to an external electrical current source which supplies an oscillating current to the nanowire so as to effect the movement of the magnetic domain wall. See U.S. Patent Application Publication No. 2007/0030718, dated Feb. 8, 2007 and entitled "Magnetic Logic System." However, the required electrical contact array and oscillating current source still result in unduly costly and complex circuit arrangements.

SUMMARY OF THE INVENTION

Illustrative embodiments of the present invention overcome the drawbacks of the conventional approaches described above by implementing magnetic logic circuits using tapered magnetic wires. Such magnetic wires are advantageously configured to allow magnetic domain walls to propagate without requiring the application of an external magnetic field or oscillating electrical current.

In one aspect of the invention, a magnetic circuit comprises a plurality of tapered magnetic wires each having a relatively wide input end and a relatively narrow output end, with the output end of a first one of the tapered magnetic wires being coupled to the input end of a second one of the tapered magnetic wires. Each of the tapered magnetic wires is configured to propagate a magnetic domain wall along a length of the wire in a direction of decreasing width from its input end to its output end.

The tapered magnetic wires may be used to form a wide variety of magnetic logic circuits and other magnetic circuit elements, including, for example, a crossover element, an AND gate, an OR gate, a NOT element, a global input element, a global output element and a logic buffer, in any desired combination.

A magnetic circuit in one or more of the illustrative embodiments comprises a magnetic logic buffer in which the plurality of tapered magnetic wires comprises first and second tapered magnetic wires, with the first tapered magnetic wire having its output end coupled to the input end of the second tapered magnetic wire. The logic buffer further comprises at least one heating element proximate the relatively wide input end of the second tapered magnetic wire. The heating element is controlled to facilitate transfer of a magnetic moment from the output end of the first tapered magnetic wire to the input end of the second tapered magnetic wire.

These and other features and advantages of the present invention will become more apparent from the accompanying drawings and the following detailed description.

BRIEF DESCRIPTION OF THE DRAWINGS

FIG. 1A shows a top view of a tapered magnetic wire in an illustrative embodiment of the invention.

FIG. 1B shows a side view of the tapered magnetic wire of FIG. 1A.

FIG. 1C illustrates the association between magnetization directions and logic states in a top layer of the tapered magnetic wire of FIGS. 1A and 1B.

FIGS. 4, 5, 6, 7, 8 and 9 show one or more views of a crossover element, an AND gate, an OR gate, a NOT element, a global input element and a global output element, respectively, each implemented using multiple tapered magnetic wires of the type shown in FIGS. 1A and 1B.

FIGS. 11A through 11D show the operation of an illustrative embodiment in which a magnetic logic buffer of the type shown in FIG. 10 comprises two parallel heating elements.

DETAILED DESCRIPTION OF PREFERRED EMBODIMENTS

Figure 2:
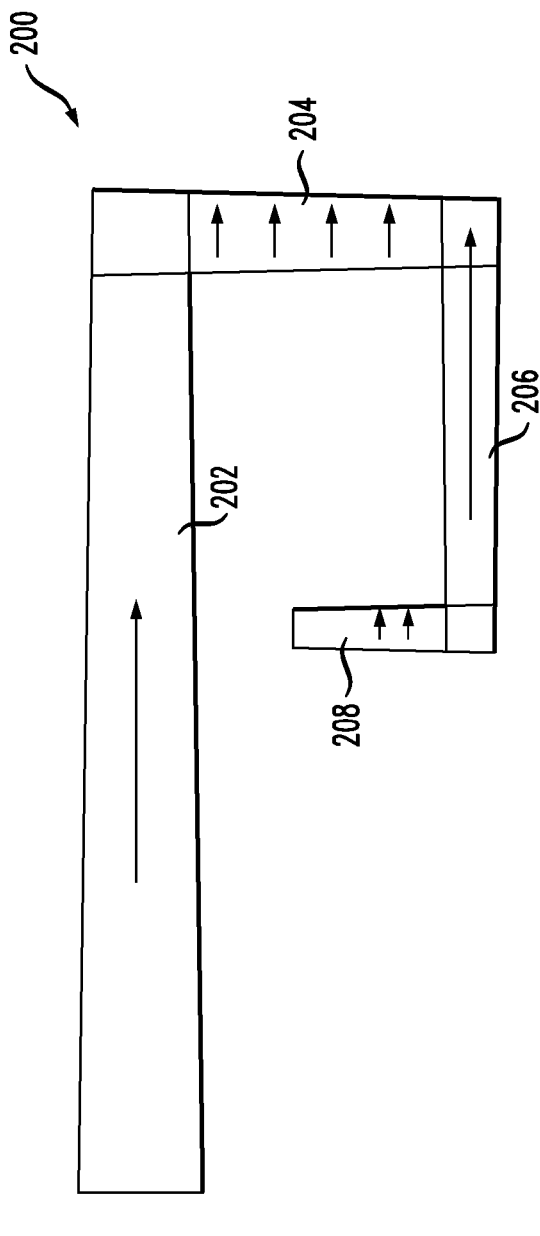
FIGS. 2 and 3 illustrate respective bending and fanout arrangements each comprising multiple tapered magnetic wires of the type shown in FIGS. 1A and 1B.

The present invention will be illustrated herein in conjunction with exemplary magnetic logic circuitry and associated techniques for configuring tapered magnetic wires so as to facilitate movement of magnetic domain walls within such circuitry. It should be understood, however, that the invention is not limited to use with the particular types of magnetic circuits and tapered magnetic wires disclosed. The invention can be implemented in a wide variety of other types of magnetic circuits, using alternative arrangements of tapered magnetic wires. For example, although aspects of the invention are illustrated in certain embodiments using particular types and arrangements of magnetic circuit elements, the disclosed techniques can be adapted for use with other types and arrangements of circuit elements, in any combination. As another example, aspects of the invention illustrated herein using in-plane magnetization can also be adapted for use with perpendicular magnetization.

FIGS. 1A and 1B show respective top and side views of a tapered magnetic wire 100 in an illustrative embodiment of the invention. The tapered magnetic wire has a relatively wide input end 102 and a relatively narrow output end 104. A magnetic domain wall 106 propagates along a length of the wire 100 in a direction of decreasing width, that is, in a direction from the relatively wide input end 102 towards the relatively narrow output end 104. The taper in the width of the magnetic wire 100 in the present embodiment is substantially continuous, from an initial largest width $w_1$ at or near input end 102 to a final smallest width $w_2$ at or near output end 104.

As shown in the side view of FIG. 1B, the tapered magnetic wire 100 comprises a plurality of layers including a top magnetic layer 110 and a bottom magnetic layer 112, each of which illustratively comprises a ferromagnetic material such as nickel-iron (NiFe), and a spacer layer 114 arranged between the top and bottom layers. The spacer layer comprises a non-magnetic metallic material such as ruthenium (Ru). Other materials such as copper (Cu) can be used for the spacer layer 114. The thickness of the spacer layer 114 is chosen so as to provide very large anti-parallel (AP) coupling of the ferromagnetic layers 110 and 112. The ferromagnetic layers are chosen to have the same moment and uniaxial intrinsic anisotropy. This trilayer structure may be formed, for example, using conventional deposition and etching techniques, suitably adapted to provide the above-noted continuous taper in width. It is to be understood in this regard that the term "magnetic wire" as used herein is intended to be broadly construed, so as to encompass, for example, a variety of different types of multi-layer structures including the illustrative structure of FIG. 1B.

The magnetization within each of the upper and lower layers 110 and 112 of the tapered magnetic wire 100 is constrained, by the intrinsic anisotropy of these layers, to lie in one of two directions illustrated by horizontal arrows. These two possible directions of magnetization correspond to respective binary logic states. The magnetic domain wall 106 separates a first direction of magnetization indicative of a first binary logic state from a second direction of magnetization indicative of a second binary logic state. FIG. 1C illustrates the association between magnetization and binary logic states in a top layer of the tapered magnetic wire of FIG. 1A. In this particular example, the left pointing magnetization direction corresponds to a logic '0' state and the right pointing magnetization direction corresponds to a logic '1' state.

As indicated above, the tapered magnetic wire 100 has a continuously tapered width from its relatively wide input end 102 to its relatively narrow output end 104. By way of example, the wire 100 may be tapered continuously from a width of about 1 micrometer ($\mu$m) at its input end to a width of about 10 nanometers (nm) at its output end. The rate of the continuous taper may be on the order of about 10 nm in width per 100 nm in length. In this case, a wire that starts at 1 $\mu$m and goes down to 10 nm can be at most about 10 $\mu$m long. A buffer configuration, of the type shown in FIG. 10, could then be used to transition to the next wire starting again at a width of 1 $\mu$m. Steeper rates of continuous taper may also be used. For example, the wire may have a rate of continuous taper of about 10 nm in width per 10 nm in length.

In the tapered magnetic wire 100, there is no net magnetic moment, and therefore to first order there is no demagnetization energy, although to second order there is a quadrupole term, which can be important when the wires are close together. Also, small applied fields do not affect the wire. The exchange energy is the largest energy in the structure, and keeps each ferromagnet as a single domain. The smaller intrinsic anisotropy energy serves to determine the direction of the magnetization. When a domain wall is introduced to the input end 102 of the wire, the exchange energy propagates the domain wall along the length of the wire, in the direction of decreasing width. This is because the domain wall utilizes a substantial amount of exchange and intrinsic anisotropy energy, compared to the uniform magnetization state. This energy is linear in the local width of the wire. Hence the structure can lower its energy by shifting the domain wall to where the width is smaller.

The continuous taper therefore causes the domain wall to propagate along the wire without the need for any separate applied force. As indicated previously, the conventional magnetic logic circuits described elsewhere herein do not utilize continuously tapered magnetic wires of the type described above, but instead use more costly and complex arrangements to cause movement of a domain wall, such as application of an external magnetic field or application of an oscillating electric current to an array of electrical contacts.

The tapered magnetic wire 100 illustrated in FIGS. 1A and 1B can be combined with other similar tapered magnetic wires to implement a wide variety of different types of logic elements and other circuit structures.

FIG. 2 illustrates a circuit structure 200 which utilizes multiple tapered magnetic wires 202, 204, 206 and 208 to implement a bend. In this arrangement, the wire width continuously tapers around corners, such that there is no loss of information flow in the structure, and similar arrangements can be used to provide other types of bends. The magnetization direction always points right or left, regardless of the physical orientation of the wires.

Figure 3:
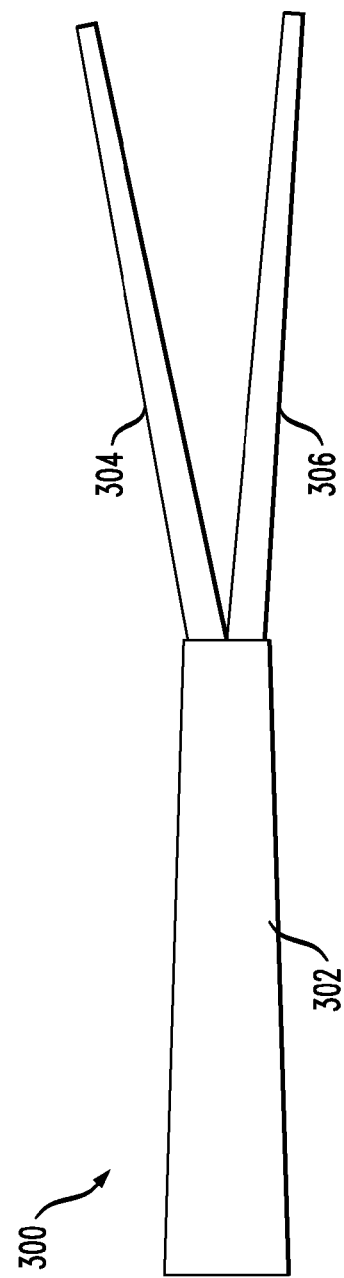

FIG. 3 shows how fanout can be achieved using multiple tapered magnetic wires. In this example, a circuit structure 300 comprises a first tapered magnetic wire 302 that fans out into two additional tapered magnetic wires 304 and 306, each of which has an initial width at its input end that is approximately one-half of the width of the output end of the first tapered magnetic wire 302. Like the first wire 302, the two additional wires 304 and 306 are both continuously tapered from their respective input ends to their respective output ends. In other embodiments, the fanout may be greater than two. For example, it is possible that three additional tapered magnetic wires may fan out from the first wire 302, with each such additional wire having an initial width at its input end that is approximately one-third of the width of the output end of the first tapered magnetic wire 302.

It should be noted that in the arrangements of FIGS. 2 and 3, and in other circuit structures described herein as being comprised of multiple tapered wires, there need not be any particular transition or boundary from one wire to another. For example, the multiple wires in structure 300 of FIG. 3 may be collectively formed as a single unitary structure having the general overall shape shown in this figure. The term "wire" as used herein is intended to encompass one or more segments of such a structure. The multiple tapered wires shown in FIGS. 2 and 3, and in other figures herein, are each depicted as individually having the same structure as the wire of FIGS. 1A and 1B, for simplicity and clarity of illustration.

A number of different logic elements each formed using multiple tapered magnetic wires of the type shown in FIGS. 1A and 1B will now be described in more detail. These include a crossover element, an AND gate, an OR gate, a NOT element, a global input element and a global output element, which will be described in conjunction with FIGS. 4, 5, 6, 7, 8 and 9, respectively. Logic buffers formed using multiple tapered magnetic wires of the type shown in FIGS. 1A and 1B will be described in conjunction with FIGS. 10 through 12.

Referring now to FIG. 4, a crossover element 400 is shown in side view in FIG. 4A and top view in FIG. 4B. The crossover element 400 in this embodiment includes magnetic wires 402, 404, 406, 408, 410 and 412 arranged as shown. Wires 402 and 404 are respective input and output tapered wires, and wires 406, 408 and 410 collectively form a bridge from the input wire 402 to the output wire 404 over bottom wire 412. The bridge is separated from the bottom wire by non-magnetic material, not explicitly shown in the figure. The vertical supports 406 and 408 of the bridge are short sections of wire in this embodiment, but could alternatively be made out of single magnetic layers, although this is not preferred because of the dipole fields. The wires 402 and 404 and top wire 410 of the bridge are continuously tapered as illustrated in the top view of FIG. 4B.

FIGS. 5 and 6 show respective AND and OR gates formed from multiple tapered magnetic wires. The gates 500 and 600 as shown in the respective top views of FIGS. 5A and 6A each comprise two input tapered magnetic wires IN1 and IN2 and a single output tapered magnetic wire OUT1. The two input wires meet the output wire at the input end of the output wire. At the input end of the output wire there is a third input 502 or 602 that comprises a pinned magnetic layer. The layer is pinned to the left in the AND gate and pinned to the right in the OR gate, as shown in FIGS. 5A and 6A, respectively. Each of the gates 500 and 600 works by majority logic. There are effectively three inputs, one of which is pinned. If two or more out of the three inputs point in one direction, then the output will also point in that direction. To simplify fabrication, the pinned layer 502 or 602 can be AP or simple pinned, so that all the antiferromagnets on one circuit can be set in the same direction. The simple pinned layer may be part of a trilayer AP layer with no net moment, in order to avoid dipole fields. Examples of different configurations of the pinned layer and other associated structural elements including spacers and antiferromagnets are shown in the side views of FIGS. 5B, 5C and 6B.

Figure 7A:
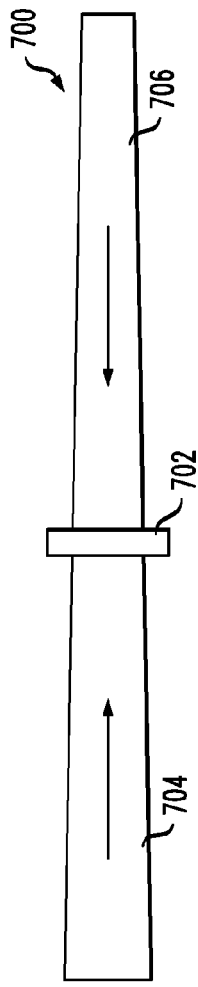
Figure 7B:
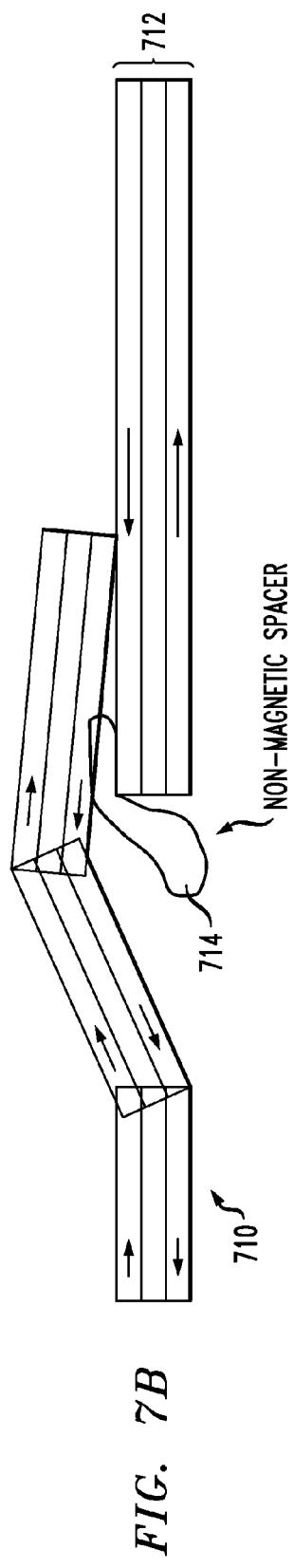
Figure 7C:
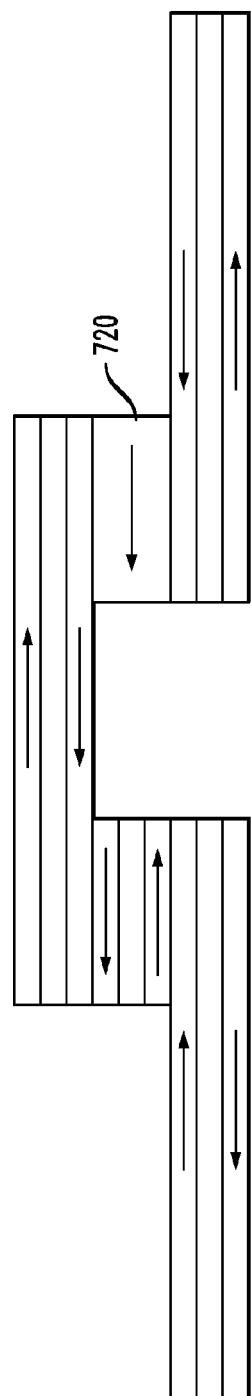

Turning now to FIG. 7, three different arrangements for achieving the NOT operation are shown in FIGS. 7A, 7B and 7C, respectively.

In the FIG. 7A arrangement, a small gap 702 is etched in an otherwise continuously tapered magnetic wire 700, to form two separated wires 704 and 706. A quadrupole field from the terminated magnetization makes the two wires 704 and 706 align antiparallel as shown. This type of arrangement works best when the wire is aligned parallel with the magnetization, although it is also possible for the wire to run perpendicular to the magnetization.

In the FIG. 7B arrangement, a tapered wire 710 coming in from the left side of the figure bends slightly and overlaps with another wire 712 going out the right side of the figure. These two wires are partially separated from one another by a non-magnetic spacer 714. Since the magnetization of the bottom of the left wire 710 is in contact with the magnetization in the top of the right wire 712, this inverts the signal. The non-magnetic spacer 714 prevents the bottom magnetic layer in the right wire 712 from being contacted by the left wire 710.

In the FIG. 7C arrangement, a bridge structure is used to implement the NOT operation. The bridge structure is similar to that formed by the wires 402, 404, 406, 408 and 410 in the crossover element of FIG. 4, but the right support 720, corresponding to wire 408 of FIG. 4, has only one magnetic layer. In general, one support can be made with an even number of magnetic layers, and the other support can be made with an odd number of magnetic layers. For example, using three magnetic layers in the right support of FIG. 7C has the added advantage of providing zero net moment in the support.

Figure 8A:
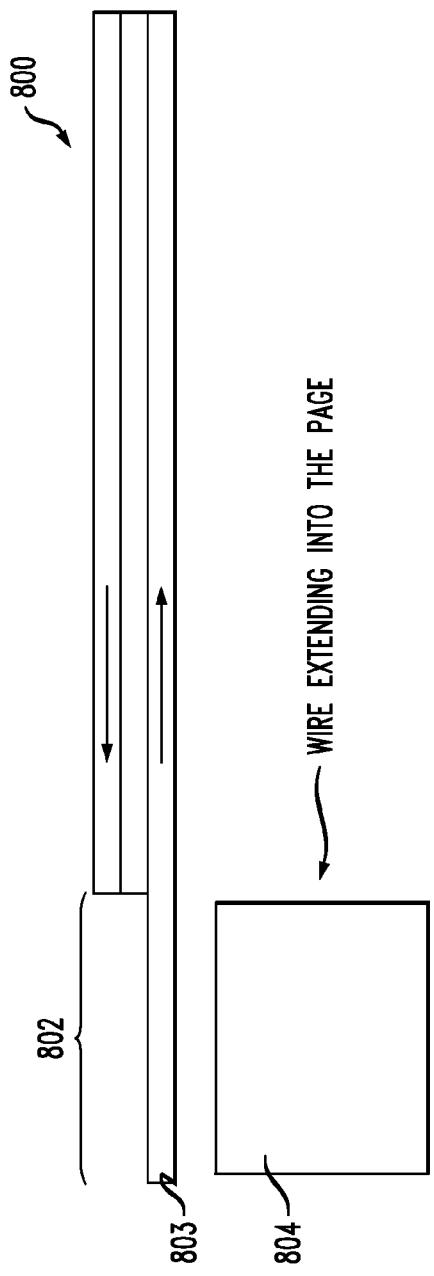
Figure 8B:
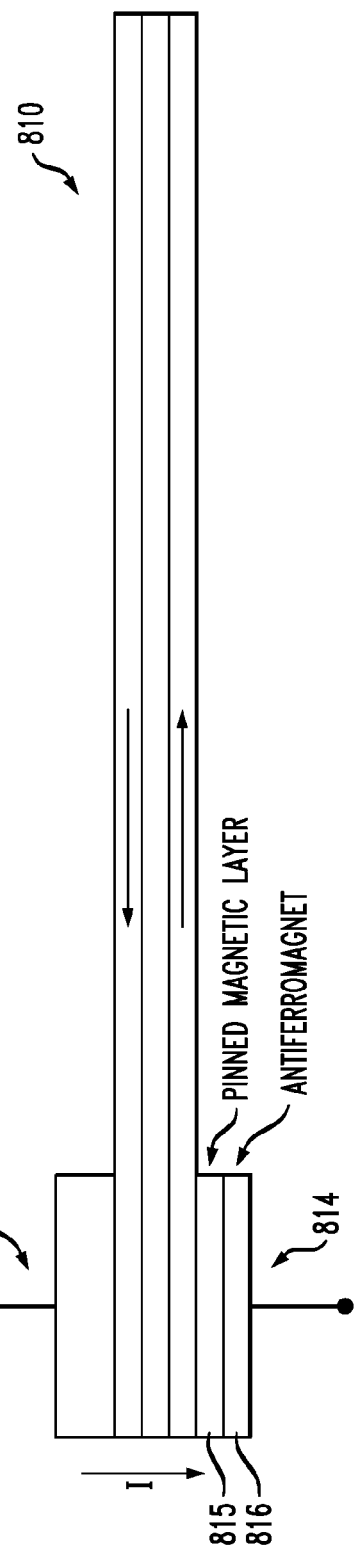

With reference now to FIG. 8, two different arrangements for inputting information into a magnetic circuit are shown in FIGS. 8A and 8B, respectively.

In the FIG. 8A arrangement, a tapered magnetic wire 800 is coupled at its input end to an additional structure 802 in which the top magnetic layer and underlying spacer layer have been etched away, leaving only the bottom magnetic layer 803 within that additional structure. An electrical wire 804 extends transverse to the magnetic wire as indicated. By passing a current either into or out of the page through the electrical wire 804, the magnetization of the bottom magnetic layer 803 can be written to either a '0' or a '1' logic state.

In the FIG. 8B arrangement, a tapered magnetic wire 810 has electrical contacts 812 and 814 above and below its input end. The lower electrical contact 814 includes a pinned magnetic layer and spacer layer, collectively designated by reference numeral 815, and an antiferromagnet 816. The spacer layer is arranged between the pinned magnetic layer and bottom magnetic layer 803. Spin injection is used to write the magnetization, using the electrical contacts 812 and 814. More particularly, by passing current either up or down through the contacts 812 and 814, a '0' or '1' logic state can be written to the input end of the wire 810.

Figure 9:
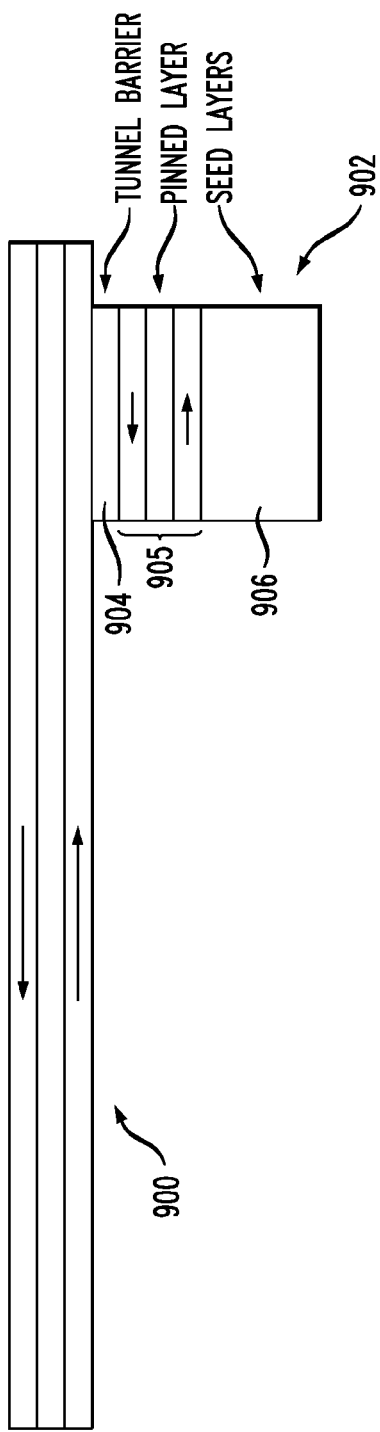

FIG. 9 shows an example of a global output element that may be used to output information from a magnetic circuit. A tapered magnetic wire 900 at its output end is coupled to an output structure 902 that is configured to sense the magnetization direction of the bottom magnetic layer of the wire 900. The output structure in this embodiment includes a tunnel barrier 904, a multi-layer structure 905 including a pinned layer, and one or more seed layers 906. In other embodiments, a similar output structure may be used to sense the magnetization direction of the upper magnetic layer of the tapered magnetic wire 900.

Figure 10:
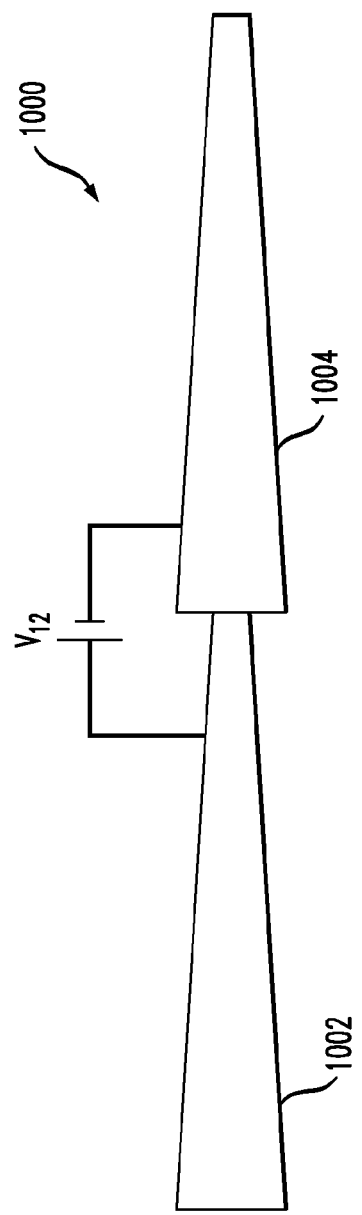
FIG. 10 illustrates the manner in which two of the tapered magnetic wires of FIGS. 1A and 1B can be coupled together to form a magnetic logic buffer.

FIG. 10 illustrates a logic buffer 1000 comprising first and second tapered magnetic wires 1002 and 1004 with the first tapered magnetic wire 1002 having its output end coupled to the input end of the second tapered magnetic wire 1004. Such an arrangement is advantageous because a given continuously tapered wire may eventually become too narrow to reliably propagate the domain wall. In such a situation, when the minimum desired width of the first tapered wire is reached, its output end is coupled to the input end of another tapered wire, as illustrated. Although the buffer 1000 in this embodiment includes only two tapered wires, alternative buffers may be formed using larger numbers of tapered wires interconnected end-to-end in a similar manner. In order to allow the information to flow through the transition from the relatively narrow output end of the first wire 1002 to the relatively wide input end of the second wire 1004, a current is passed from the output end of the first wire to the input end of the second wire using the applied voltage $V_{12}$. The spin torque effect pushes the domain wall from the relatively narrow output end of the first wire 1002 into the relatively wide input end of the second wire 1004.

Alternative arrangements for moving a domain wall across the interface between the relatively narrow output end of first wire 1002 and the relatively wide input end of the second wire 1004 will now be described with reference to FIGS. 11 and 12. These arrangements advantageously avoid the need to apply a current at the interface as in the arrangement shown in FIG. 10. Instead of applying a current at the interface, the arrangements of FIGS. 11 and 12 utilize one or more heating elements proximate the relatively wide input end of the second tapered magnetic wire 1004, with the heating element being controlled to facilitate transfer of a magnetic moment from the output end of the first tapered magnetic wire 1002 to the input end of the second tapered magnetic wire 1004.

In the arrangements shown in FIGS. 11 and 12, the first and second tapered magnetic wires 1002 and 1004 of the logic buffer will be denoted as W1 and W2, respectively. As will be described, the logic buffers in these embodiments utilize one or more heating elements, illustratively implemented as current-controlled heaters, which when activated reduce the magnetization of the magnetic layers at the relatively wide input end of the second tapered wire. This allows the domain wall from the relatively narrow output end of the first tapered wire to seed the magnetization direction in the wider input end of the second tapered wire. Upon cooling, a new domain wall will exist and continue propagating in the second tapered wire as it had previously in the first tapered wire.

Referring now to the FIG. 11, this arrangement utilizes first and second heating elements H1 and H2 arranged substantially parallel to one another at the input end of the second tapered magnetic wire W2 and substantially perpendicular to a direction of propagation of a magnetic domain wall in the second tapered magnetic wire W2. Each heating element may be controlled, for example, between an on state and an off state, by controlling an amount of current passing through the heating element.

Figure 11A:
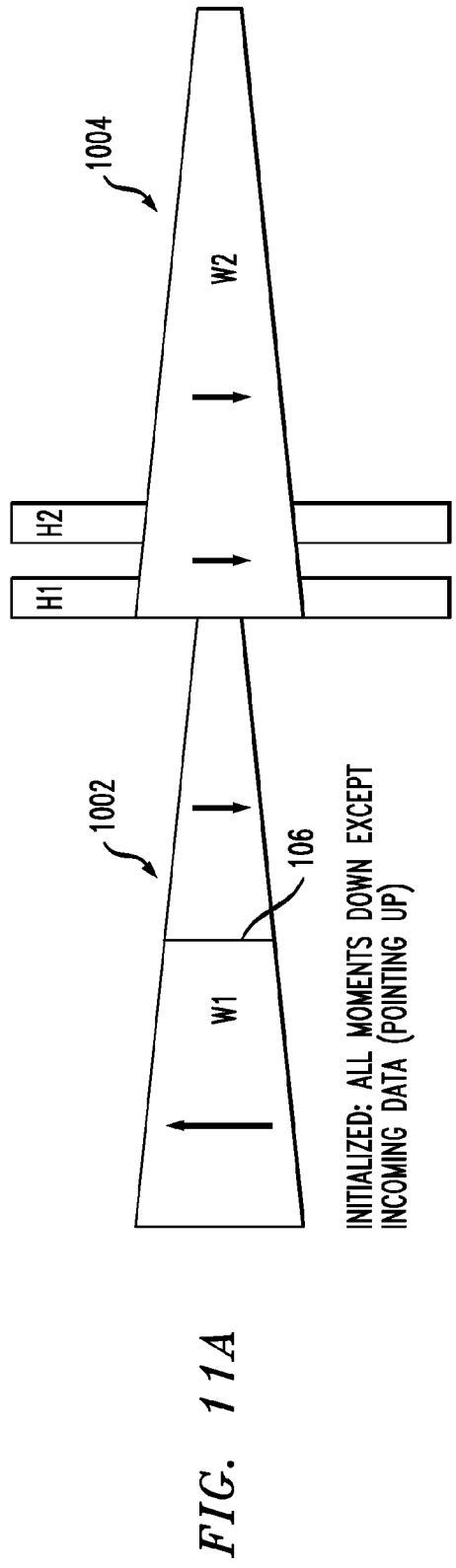

FIG. 11A shows an initialized condition, before a domain wall 106 that is propagating in the first wire W1 reaches the interface with the second wire W2. At this point, all of the magnetic moments in W1 and W2 are pointing down, except for the magnetic moment associated with the incoming data, to the left of the propagating domain wall 106, which is pointing up.

Figure 11B:
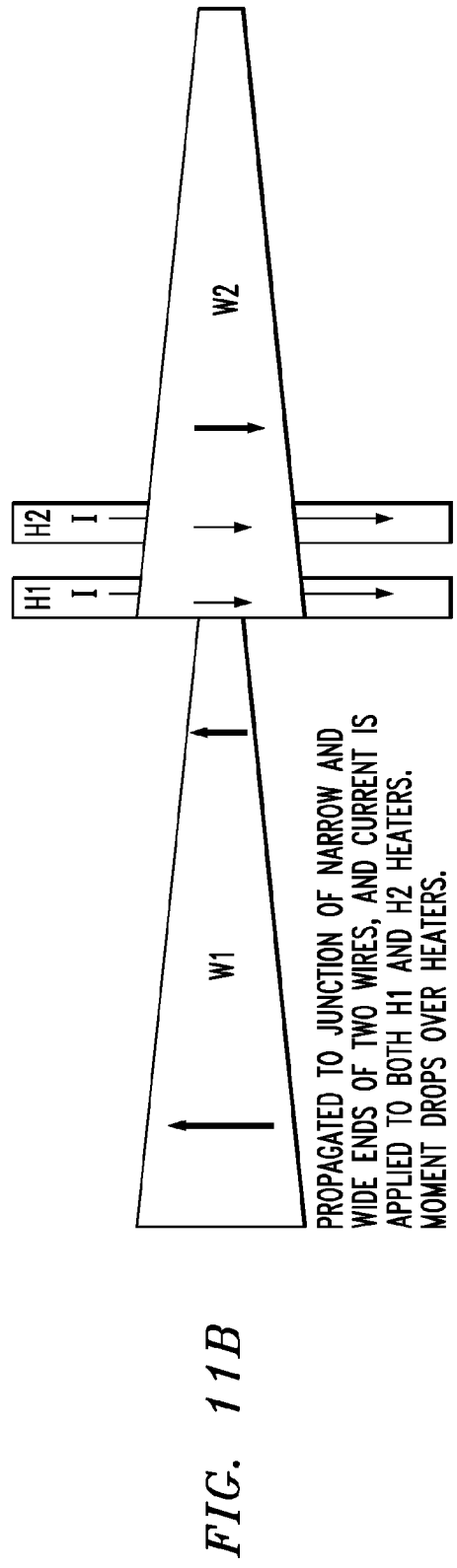

As illustrated in FIG. 11B, in conjunction with the magnetic domain wall 106 in the first tapered magnetic wire W1 reaching the output end of that wire, the first and second heating elements H1 and H2 are each transitioned from an off state to an on state so as to reduce a magnitude of an existing magnetic moment at the input end of the second tapered magnetic wire W2.

The first heating element H1 is subsequently transitioned from its on state to its off state while the second heating element H2 remains in its on state, as shown in FIG. 11C. This serves to seed the input end of the second tapered magnetic wire W2 with the orientation of the magnetic moment to be transferred from the output end of the first tapered magnetic wire W1. It should be noted that the moment in W2 to the right of H2 does not influence the domain in W2 above H1 since the magnetization path is "broken" by the elevated temperature above H2.

The transfer of the domain wall from first tapered magnetic wire W1 to second tapered magnetic wire W2 is then completed by transitioning the second heating element H2 from its on state to its off state, as indicated in FIG. 11D.

In the alternative embodiment of FIG. 12, only a single heating element H1 is arranged at the input end of the second tapered magnetic wire W2. Like the heating elements in the FIG. 11 embodiment, the heating element H1 in this embodiment is arranged substantially perpendicular to a direction of propagation of a magnetic domain wall in the second tapered magnetic wire W2.

Figure 12A:
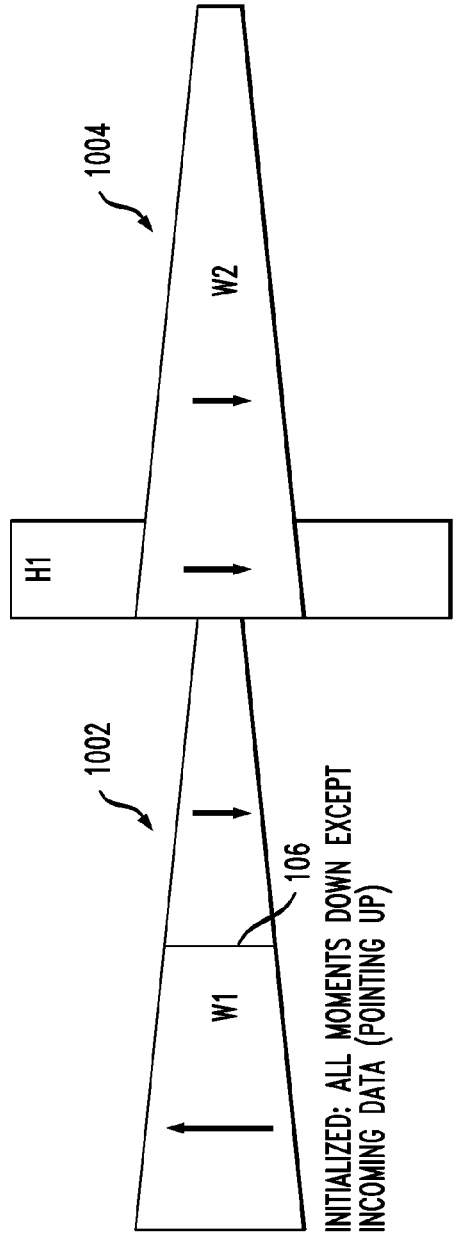
FIGS. 12A through 12C show the operation of an illustrative embodiment in which a magnetic logic buffer of the type shown in FIG. 10 comprises a single heating element.

FIG. 12A shows an initialized condition, before a domain wall 106 that is propagating in the first wire W1 reaches the interface with the second wire W2. At this point, all of the magnetic moments in W1 and W2 are pointing down, except for the magnetic moment associated with the incoming data, to the left of the propagating domain wall 106, which is pointing up.

Figure 12B:
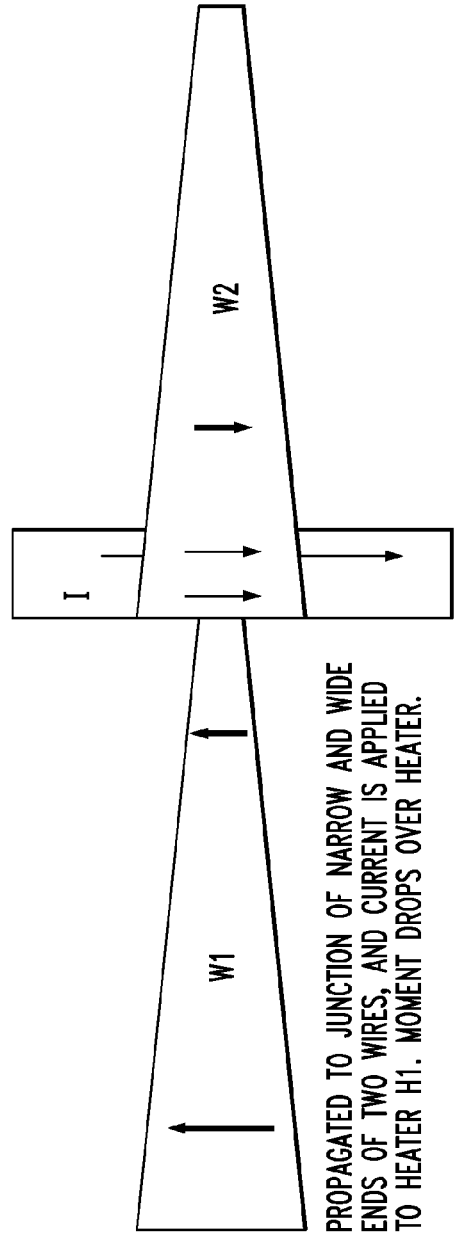
Figure 12C:
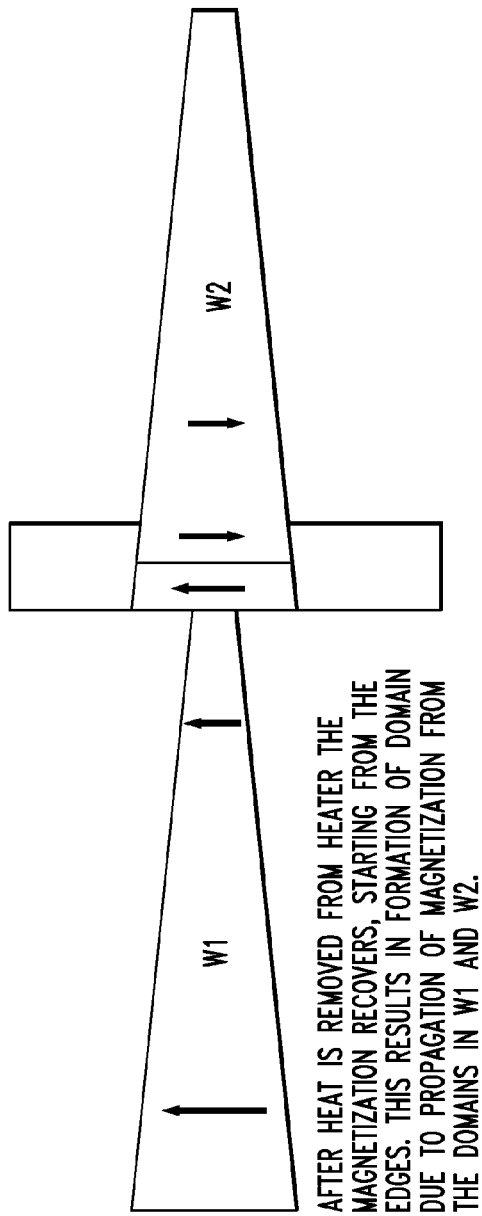

As illustrated in FIG. 12B, in conjunction with the magnetic domain wall 106 in the first tapered magnetic wire W1 reaching the output end of that wire, the single heating element H1 is transitioned from an off state to an on state so as to reduce a magnitude of an existing magnetic moment at the input end of the second tapered magnetic wire W2. The single heating element H1 is subsequently transitioned from its on state to its off state to complete the transfer of the magnetic moment from the output end of W1 to the input end of W2, as indicated in FIG. 12C. More particularly, after the heating element H1 is turned off, the magnetization recovers, starting from the edges, resulting in formation at the input end of W2 of a magnetic domain transferred from W1.

It is to be understood that in circuits having one or more logic buffers such as those shown in FIGS. 11 and 12, the associated heating pulses may be applied regularly, as part of a clock cycle, or alternatively they may be applied only when a domain wall has reached the buffer.

Figure 13:
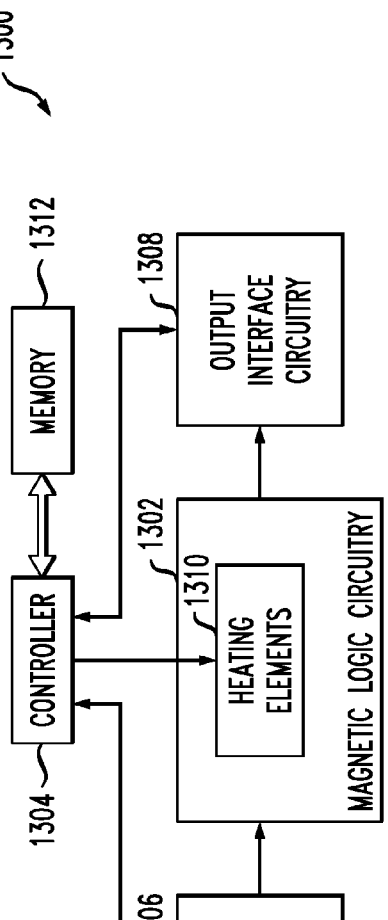
FIG. 13 shows a system that incorporates magnetic logic circuitry and an associated controller.

FIG. 13 shows an example of an information processing system 1300 that incorporates magnetic logic circuitry 1302 and an associated controller 1304. The magnetic logic circuitry 1302, which may comprise any combination of the various logic elements and other circuit elements described above, is coupled between input interface circuitry 1306 and output interface circuitry 1308. The interface circuitry 1306 and 1308 is coupled to controller 1304 such that data signals may be supplied to and output from the magnetic logic circuitry 1302 under the control of the controller 1304. The controller 1304 also controls the operation of any heating elements 1310 that may be associated with logic buffers of the magnetic logic circuitry. Associated with the controller 1304 is a memory 1312 which may store instructions or other program code that is executed by the controller in controlling the operation of the system. The memory 1312 is an example of what is more generally referred to herein as a computer program product having embodied therein executable program code, and may comprise electronic memory such as RAM or ROM, magnetic memory, disk-based memory, optical memory or other types of storage elements, in any combination. The controller may comprise a microprocessor, microcontroller, application-specific integrated circuit (ASIC) or other processing device for executing program code stored in memory 1312.

The magnetic logic circuitry 1302 and one or more other elements of the system 1300 may be implemented at least in part in the form of an integrated circuit. For example, in a given implementation the entire system 1300 may be embodied in a single ASIC. The system 1300 is just one example of an information processing system that comprises magnetic logic circuitry of the type disclosed herein, and numerous alternative system configurations may be used in practicing the invention. Such systems may comprise processing devices such as, for example, computers, servers, mobile communication devices, etc.

The illustrative embodiments described above provide magnetic logic circuitry formed from tapered magnetic wires that are specifically configured to allow domain walls to propagate without the need for application of an external magnetic field or application of an oscillating electric current to an array of electrical contacts. The resulting magnetic circuitry is therefore less complex and can be made at lower cost than conventional arrangements.

It is to be appreciated that the particular embodiments described in conjunction with FIGS. 1 through 13 are illustrative only. For example, in alternative embodiments, the magnetization direction may be perpendicular to the plane of the circuit, as in an embodiment in which the tapered magnetic wire includes a single magnetic layer with magnetization perpendicular to the plane. Also, the positioning, configuration and number of heating elements may be varied in alternative embodiments. As yet another example, magnetic vias can be formed using vertical sections of wire, with each such section connecting two different wiring levels. The magnetic vias can be made out of n magnetic layers, with n=1, 2, 3 . . . . This can allow magnetic circuits to be stacked on top of each other, with magnetic vias connecting them. Embodiments including such vias may comprise any desired number of layers of magnetic circuits. These and numerous other alternative embodiments within the scope of the appended claims will be readily apparent to those skilled in the art.

What is claimed is:

1. A magnetic circuit comprising:
a plurality of tapered magnetic wires each having a relatively wide input end and a relatively narrow output end;
wherein the output end of one of the tapered magnetic wires is coupled to the input end of another of the tapered magnetic wires; and
wherein each of the tapered magnetic wires is configured to propagate a magnetic domain wall along a length of the wire in a direction of decreasing width from its input end to its output end.

2. The magnetic circuit of claim 1 wherein at least one of the tapered magnetic wires is tapered continuously from a width of about 1 micrometer at its input end to a width of about 10 nanometers at its output end.

3. The magnetic circuit of claim 1 wherein at least one of the tapered magnetic wires is tapered continuously at a rate of about 10 nanometers in width per 100 nanometers in length.

4. The magnetic circuit of claim 1 wherein at least one of the tapered magnetic wires is tapered continuously at a rate of about 10 nanometers in width per 10 nanometers in length.

5. The magnetic circuit of claim 1 comprising a magnetic logic gate in which the plurality of tapered magnetic wires comprises first and second tapered magnetic wires associated with respective first and second input signals and a third tapered magnetic wire having its input end coupled to output ends of the first and second tapered magnetic wires and providing an output signal that is a logic function of the first and second input signals.

6. The magnetic circuit of claim 1 comprising a magnetic logic buffer in which the plurality of tapered magnetic wires comprises first and second tapered magnetic wires with the first tapered magnetic wire having its output end coupled to the input end of the second tapered magnetic wire.

7. The magnetic circuit of claim 6 further comprising at least one heating element proximate the relatively wide input end of the second tapered magnetic wire, wherein the heating element is controlled to facilitate transfer of a magnetic moment from the output end of the first tapered magnetic wire to the input end of the second tapered magnetic wire.

8. The magnetic circuit of claim 7 wherein said at least one heating element is controlled between an on state and an off state by controlling an amount of current passing through the heating element.

9. The magnetic circuit of claim 7 wherein said at least one heating element comprises first and second heating elements arranged substantially parallel to one another at the input end of the second tapered magnetic wire and substantially perpendicular to a direction of propagation of a magnetic domain wall in the second tapered magnetic wire.

10. The magnetic circuit of claim 9 wherein in conjunction with a magnetic domain wall in the first tapered magnetic wire reaching the output end of the first tapered magnetic wire, the first and second heating elements are each transitioned from an off state to an on state so as to reduce a magnitude of an existing magnetic moment at the input end of the second tapered magnetic wire.

11. The magnetic circuit of claim 10 wherein the first heating element is subsequently transitioned from its on state to its off state while the second heating element remains in its on state, so as to seed the input end of the second tapered magnetic wire with the magnetic moment to be transferred from the output end of the first tapered magnetic wire to the input end of the second tapered magnetic wire.

12. The magnetic circuit of claim 11 wherein the second heating element is subsequently transitioned from its on state to its off state to complete the transfer of the magnetic moment from the output end of the first tapered magnetic wire to the input end of the second tapered magnetic wire.

13. The magnetic circuit of claim 7 wherein said at least one heating element comprises a single heating element arranged at the input end of the second tapered magnetic wire and substantially perpendicular to a direction of propagation of a magnetic domain wall in the second tapered magnetic wire.

14. The magnetic circuit of claim 13 wherein in conjunction with a magnetic domain wall in the first tapered magnetic wire reaching the output end of the first tapered magnetic wire, the single heating element is transitioned from an off state to an on state so as to reduce a magnitude of an existing magnetic moment at the input end of the second tapered magnetic wire, and the single heating element is subsequently transitioned from its on state to its off state to complete the transfer of the magnetic moment from the output end of the first tapered magnetic wire to the input end of the second tapered magnetic wire.

15. A method comprising:
providing a plurality of tapered magnetic wires each having a relatively wide input end and a relatively narrow output end, with the output end of a first one of the tapered magnetic wires being coupled to the input end of a second one of the tapered magnetic wires; and
controlling an input signal applied to at least one of the tapered magnetic wires to propagate a magnetic domain wall along a length of the wire in a direction of decreasing width from its input end to its output end.

16. The method of claim 15 further comprising controlling a temperature of the input end of the second tapered magnetic wire to facilitate transfer of a magnetic moment from the output end of the first tapered magnetic wire to the input end of the second tapered magnetic wire.

17. A computer program product having embodied therein executable program code that when executed by a controller causes the controller to perform the controlling step of claim 15.

18. An apparatus comprising:
magnetic logic circuitry; and
a controller coupled to the magnetic logic circuitry;
the magnetic logic circuitry comprising at least one magnetic logic circuit that includes a plurality of tapered magnetic wires each having a relatively wide input end and a relatively narrow output end, with the output end of one of the tapered magnetic wires being coupled to the input end of another of the tapered magnetic wires;

wherein each of the tapered magnetic wires is configured to propagate a magnetic domain wall along a length of the wire in a direction of decreasing width from its input end to its output end.

19. The apparatus of claim 18 wherein the magnetic logic circuit comprises a magnetic logic gate in which the plurality of tapered magnetic wires comprises first and second tapered magnetic wires associated with respective first and second input signals and a third tapered magnetic wire having its input end coupled to output ends of the first and second tapered magnetic wires and providing an output signal that is a logic function of the first and second input signals.

20. An integrated circuit comprising the apparatus of claim 18.

* * * * *